United States Patent
Hirota et al.

(10) Patent No.: US 9,911,576 B2
(45) Date of Patent: *Mar. 6, 2018

(54) ION BOMBARDMENT APPARATUS AND METHOD FOR CLEANING OF SURFACE OF BASE MATERIAL USING THE SAME

(71) Applicant: Kobe Steel, Ltd., Kobe-shi (JP)

(72) Inventors: Satoshi Hirota, Takasago (JP); Naoyuki Goto, Takasago (JP); Homare Nomura, Takasago (JP); Rainer Cremer, Monschau (DE)

(73) Assignee: Kobe Steel, Ltd., Kobe-shi (JP)

( * ) Notice: Subject to any disclaimer, the term of this patent is extended or adjusted under 35 U.S.C. 154(b) by 842 days.

This patent is subject to a terminal disclaimer.

(21) Appl. No.: 13/666,038

(22) Filed: Nov. 1, 2012

(65) Prior Publication Data

US 2013/0133690 A1   May 30, 2013

(30) Foreign Application Priority Data

Nov. 25, 2011  (JP) .................................. 2011-257819

(51) Int. Cl.
*B08B 13/00*   (2006.01)
*H01J 37/32*   (2006.01)
(Continued)

(52) U.S. Cl.
CPC ...... H01J 37/32018 (2013.01); C23C 14/022 (2013.01); C23C 14/325 (2013.01);
(Continued)

(58) Field of Classification Search
CPC ..... C23C 14/022; C23C 14/325; C23C 14/54; C23C 14/564; H01J 37/32018; H01J 37/32403; H01J 37/32862
(Continued)

(56) References Cited

U.S. PATENT DOCUMENTS 4,724,058 A * 2/1988 Morrison, Jr. ........ C23C 14/325
                                                                118/50.1
5,192,523 A * 3/1993 Wu ......................... C23C 16/26
                                                                204/157.47
(Continued)

FOREIGN PATENT DOCUMENTS

GB    2 323 855 A      10/1998
GB    2323855  A   *  10/1998  ........... C23C 14/022
(Continued)

OTHER PUBLICATIONS

Machine translation of JP2002/371351A dated Dec. 2002.*
(Continued)

*Primary Examiner* — Douglas Lee
(74) *Attorney, Agent, or Firm* — Oblon, McClelland, Maier & Neustadt, L.L.P.

(57) ABSTRACT

In an ion bombardment apparatus of the present invention, a heating type thermal electron emission electrode formed by a filament is placed on one inner surface of a vacuum chamber, an anode for receiving a thermal electron from the thermal electron emission electrode is placed on another inner surface of the vacuum chamber, and a base material is placed between the thermal electron emission electrode and the anode. Further, the ion bombardment apparatus has a discharge power supply for generating a glow discharge upon application of a potential difference between the thermal electron emission electrode and the anode, a heating power supply for heating the thermal electron emission electrode so as to emit the thermal electron, and a bias power supply for applying negative pulse-shaped bias potential with respect to the vacuum chamber to the base material.

14 Claims, 6 Drawing Sheets

(51) Int. Cl.
  *C23C 14/02* (2006.01)
  *C23C 14/32* (2006.01)
  *C23C 14/54* (2006.01)
  *C23C 14/56* (2006.01)

(52) U.S. Cl.
  CPC ............ *C23C 14/54* (2013.01); *C23C 14/564* (2013.01); *H01J 37/32403* (2013.01); *H01J 37/32862* (2013.01)

(58) Field of Classification Search
  USPC ...................................... 134/1.1; 156/345.37
  See application file for complete search history.

(56) References Cited

U.S. PATENT DOCUMENTS

| | | | |
|---|---|---|---|
| 5,294,322 | A | 3/1994 | Vetter et al. |
| 5,709,784 | A | 1/1998 | Braendle et al. |
| 2003/0233981 | A1* | 12/2003 | Sasaguri ............... C23C 16/26 118/723 E |
| 2004/0038033 | A1* | 2/2004 | Massler ............... C23C 16/029 428/408 |
| 2008/0020138 | A1 | 1/2008 | Ramm et al. |
| 2008/0090099 | A1* | 4/2008 | Ramm ............... C23C 14/0021 428/699 |
| 2008/0311310 | A1 | 12/2008 | Massler et al. |
| 2013/0061872 | A1 | 3/2013 | Goto et al. |

FOREIGN PATENT DOCUMENTS

| | | | |
|---|---|---|---|
| JP | 2000-336492 | A | 12/2000 |
| JP | 2002-371351 | A | 12/2002 |
| JP | 2002371351 | A * | 12/2002 |
| JP | 2006-22368 | A | 1/2006 |
| JP | 4208258 | | 10/2008 |
| JP | 2010-126762 | A | 6/2010 |
| JP | 2011-252193 | A | 12/2011 |
| WO | WO 2010/082340 | A1 | 7/2010 |
| WO | WO 2011/151979 | A1 | 12/2011 |

OTHER PUBLICATIONS

Machine translation of JP2002-371351A dated Dec. 2002.*
U.S. Appl. No. 13/697,710, filed Nov. 13, 2012, Goto, et al.
Extended European Search Report dated Mar. 18, 2013 in Patent Application No. 12191192.9.

* cited by examiner

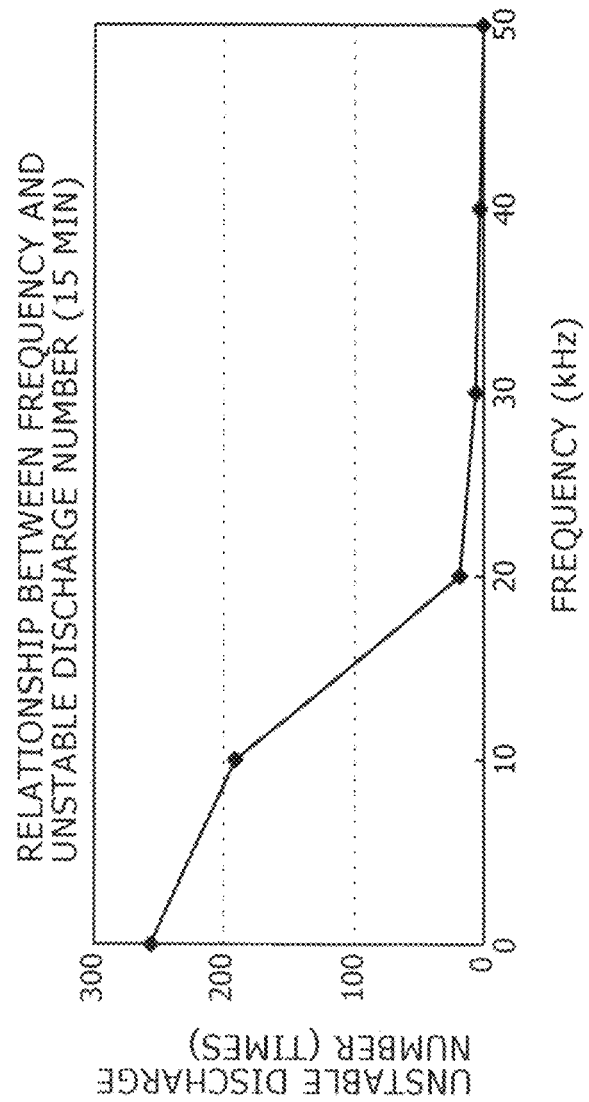

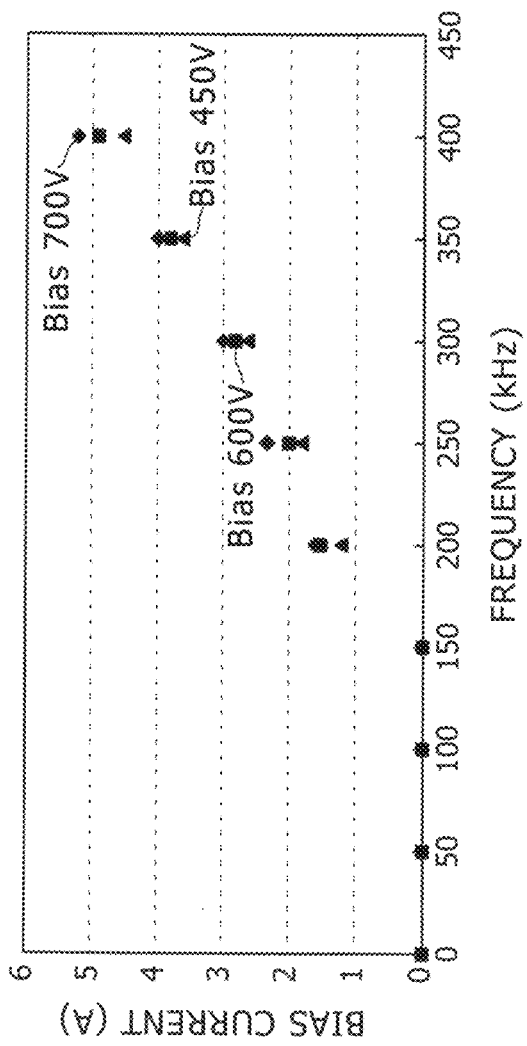

CONVENTIONAL CONDITION (STANDARD CONDITION)

CONDITION OF THE PRESENT INVENTION (NEW CONDITION)

F I G . 7
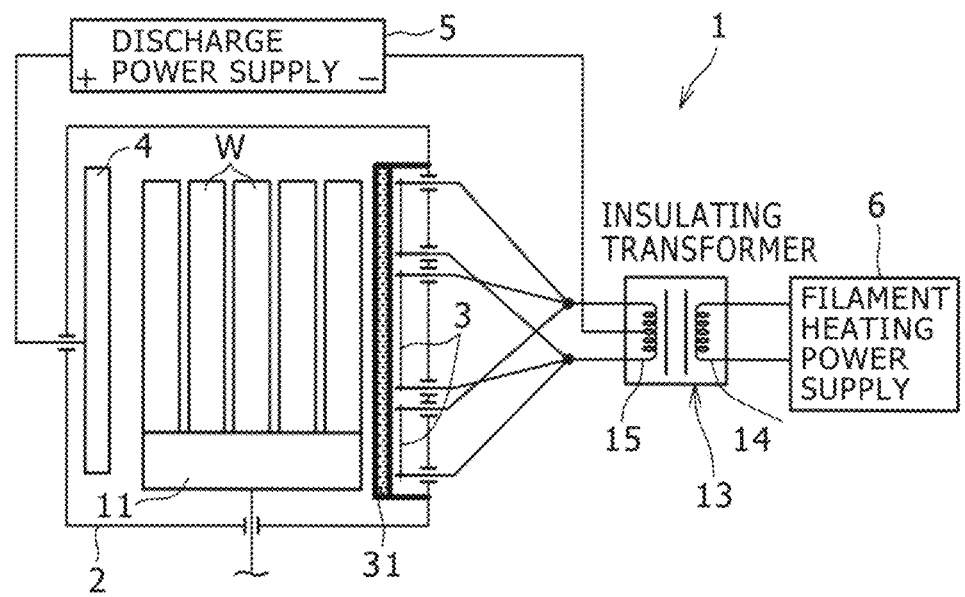
F I G . 8
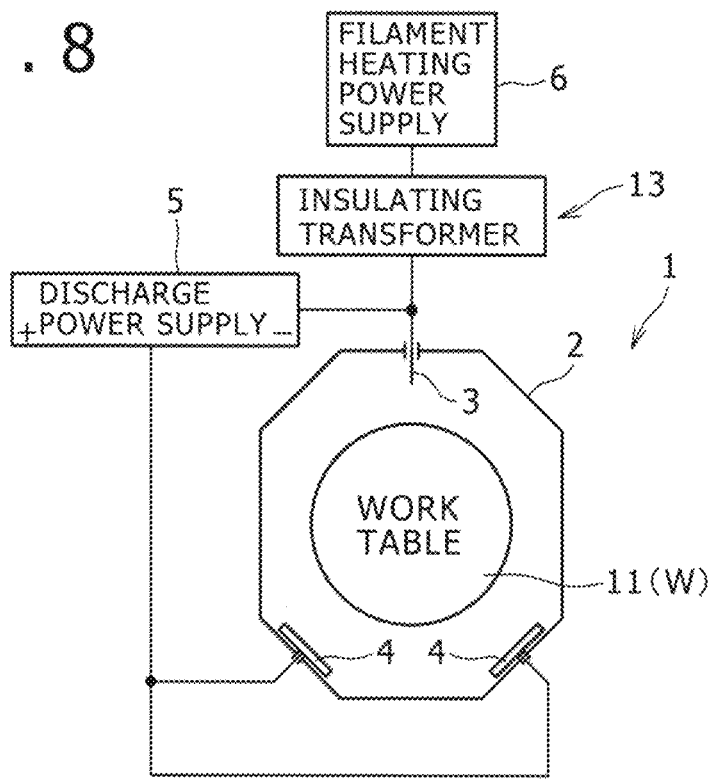

ION BOMBARDMENT APPARATUS AND METHOD FOR CLEANING OF SURFACE OF BASE MATERIAL USING THE SAME

BACKGROUND OF THE INVENTION

Field of the Invention

The present invention relates to an ion bombardment apparatus capable of cleaning a surface of a base material as a pre-treatment of film formation, and a method for cleaning of the surface of the base material using this apparatus.

Description of the Related Art

Conventionally, for the purpose of improving abrasion resistance of a cutting tool and improving a sliding characteristic of a sliding surface of a mechanical part, a hard film (of TiN, TiAlN, CrN, or the like) is formed on a base material (film formation object) by the physical vapor deposition (PVD) method. An apparatus used for forming such a hard film includes a physical vapor deposition apparatus such as an arc ion plating apparatus and a sputtering apparatus.

In such a physical vapor deposition apparatus, in order to improve adhesion of the film to be formed, it is known that a surface of the base material is purified (cleaned) before forming the film. This pre-treatment includes heating cleaning with electron bombardment and a method for cleaning by generating heavy inert gas ions such as argon ions with plasma discharge and irradiating the ions from this plasma to the base material so as to heat the surface (ion bombardment method).

As a technique for performing the pre-treatment of the film formation described above, U.S. Pat. No. 5,294,322 describes an apparatus for cleaning a surface or heating a base material before film formation. In this apparatus, an arc evaporation source including a shutter openable and closable relative to the base material, and an anode independent from this arc evaporation source in a chamber. An inert gas such as an argon gas is introduced into the chamber, argon ions are generated by utilizing arc discharge caused between the arc evaporation source whose front surface is covered by the shutter and the chamber, and the argon ions are irradiated to the surface of the base material having negative potential by applying potential between the anode and the base material, so that the surface of the base material is cleaned.

Japanese Patent No. 4208258 discloses a technique for cleaning a surface of a base material by forming arc discharge (plasma supply source) in a space vertically ranging over treatment height of the base material or this treatment height or more on the inner circumferential side or the outer circumferential side of the base material placed around a vertically center axis in a vacuum chamber, and irradiating argon ions generated therein to the base material to which negative bias voltage is applied.

However, the apparatuses for cleaning the surface of the base material as described above hold the following problems.

In the apparatus of U.S. Pat. No. 5,294,322, a temperature of the shutter for covering the front surface of the arc evaporation source becomes high, and a temperature of the base material also becomes high upon receiving radiation heat thereof. Thus, the apparatus is not easily applied to a base material requiring a treatment at a low temperature such as a quenching material. Since droplets from the arc evaporation source are attached to the shutter, frequent maintenance is required. In addition, since the evaporation source cannot be completely covered by the shutter, there is a problem that some droplets are attached to the base material.

Further, this related art is the technique substantially using a titanium target. However, since the apparatus requires a too large space as a mechanism for only cleaning by ion bombardment, cost thereof is high.

Meanwhile, the apparatus of Japanese Patent No. 4208258 is to charge a gas into a negative electrode chamber separately provided in an upper part of the vacuum chamber so as to generate a difference (pressure gradient) between inner pressure of the negative electrode chamber and inner pressure of the vacuum chamber, and by utilizing this pressure gradient, swiftly jet the gas in the negative electrode chamber into the vacuum chamber from a small opening, so as to generate plasma along the vertically center axis.

However, it is essential to charge the gas into the negative electrode chamber at predetermined pressure in order to generate the pressure gradient. There is a need for severely adjusting a diameter of the small opening in order to swiftly jet the gas into the vacuum chamber. Since a peripheral part of the small opening formed of expensive molybdenum or the like is always exposed to gas jet, the peripheral part is harshly worn away. Thus, an economical burden is increased.

In order to evenly clean the surface of the base material, an increase in size of the apparatus is unavoidable, and a plurality of positive electrodes is placed, so that a system is complicated. Thus, a distance between the surface of the base material and the plasma (that is, a cleaning effect) is not easily maintained constantly.

Further, in a case of cleaning of the surface of the base material using such an apparatus, when pressure of a process gas is high, a distance of potential gradient (sheath) generated around the base material is extended. Therefore, in a case of the base material having a complicated shape (for example having a groove part), the sheath is not generated along the complicated shape part but generated so as to surround the whole base material, so that the gas ions such as Ar ions cannot reach the complicated shape part. As a result, the base material having a complicated shape cannot be uniformly cleaned. Conversely, when the pressure of the process gas is low, there is a problem that a plasma state (state that the ions and electrons are disassociated) is not easily maintained.

In addition, there are not only the problems for cleaning described above but also problematic points for a circuit in these apparatuses (apparatus described in U.S. Pat. No. 5,294,322 in particular). That is, since all the power supplies are connected via the vacuum chamber, the power supplies form a loop via the chamber. When such a loop is formed, a problem that current control is instabilized is generated in a case where GNDs (grounds) actually have different potential from each other or the like.

SUMMARY OF THE INVENTION

In consideration with the above problems, an object of the present invention is to provide an ion bombardment apparatus capable of enhancing a cleaning effect of a base material even when the base material has a complicated shape and stabilizing control of power supplies, and a method for cleaning of a surface of the base material using this apparatus.

In order to achieve the above object, the present invention adopts the following technical means.

The present invention is an ion bombardment apparatus for cleaning a surface of a base material placed in a vacuum chamber by irradiating gas ions generated in the vacuum chamber, including a heating type thermal electron emission electrode placed on one inner surface of the vacuum chamber and formed by a filament, an anode placed on another inner surface of the vacuum chamber, the anode for receiving a thermal electron from the thermal electron emission electrode, a discharge power supply for generating a glow discharge upon application of a potential difference between the thermal electron emission electrode and the anode, the discharge power supply being insulated from the vacuum chamber, a heating power supply for heating the thermal electron emission electrode so as to emit the thermal electron, and a bias power supply for applying negative potential with respect to the vacuum chamber to the base material, the bias power supply serving as a pulse power supply, wherein the gas ions generated in the vicinity of the base material by the discharge power supply, the heating power supply, and the bias power supply are capable of being irradiated to the surface of the base material.

In the above ion bombardment apparatus, preferably, the negative potential applied to the base material by the pulse power supply has a frequency of 20 kHz or more, further a frequency of 200 kHz or more.

In the above ion bombardment apparatus, the thermal electron emission electrode may include a plurality of filaments.

In the above ion bombardment apparatus, length of the thermal electron emission electrode may be the same as or more than a space where the base material is treated.

In the above ion bombardment apparatus, the base material may be placed between the thermal electron emission electrode and the anode.

In the above ion bombardment apparatus, the anode may include an arc evaporation source. Further, a power supply of the thermal electron emission electrode may include a power supply of the arc evaporation source.

In the above ion bombardment apparatus, a positive side output of the discharge power supply may be selectively connectable to the anode and the base material.

The present invention is a method for cleaning of a surface of a base material before film formation using the above ion bombardment apparatus, including the steps of maintaining a heating current flowing through the thermal electron emission electrode and gas pressure of a gas atmosphere in the vacuum chamber until a glow discharge is started between the thermal electron emission electrode and the anode, the heating current and the gas pressure being required for start of the glow discharge, lowering the gas pressure and the heating current to values with which the discharge is sustainable after the discharge is started, and activating the bias power supply so as to apply pulse-shaped bias voltage to the base material after the discharge is started.

According to the present invention, the cleaning effect of the base material can be enhanced even when the base material has a complicated shape and the control of the power supplies can be stabilized.

BRIEF DESCRIPTION OF THE DRAWINGS

FIG. 3A is a graph showing a relationship between a pulse frequency of a bias power supply and the generation number of unstable discharge;

FIG. 3B is a graph showing a relationship between the pulse frequency of the bias power supply and a bias current;

FIG. 7 is a schematic view showing the ion bombardment apparatus according to a second embodiment of the present invention; and FIG. 8 is a schematic view showing the planar direction of the ion bombardment apparatus according to a third embodiment of the present invention.

DESCRIPTION OF THE PREFERRED EMBODIMENTS

Hereinafter, embodiments of the present invention will be described based on the drawings.

First Embodiment

Figure 1:
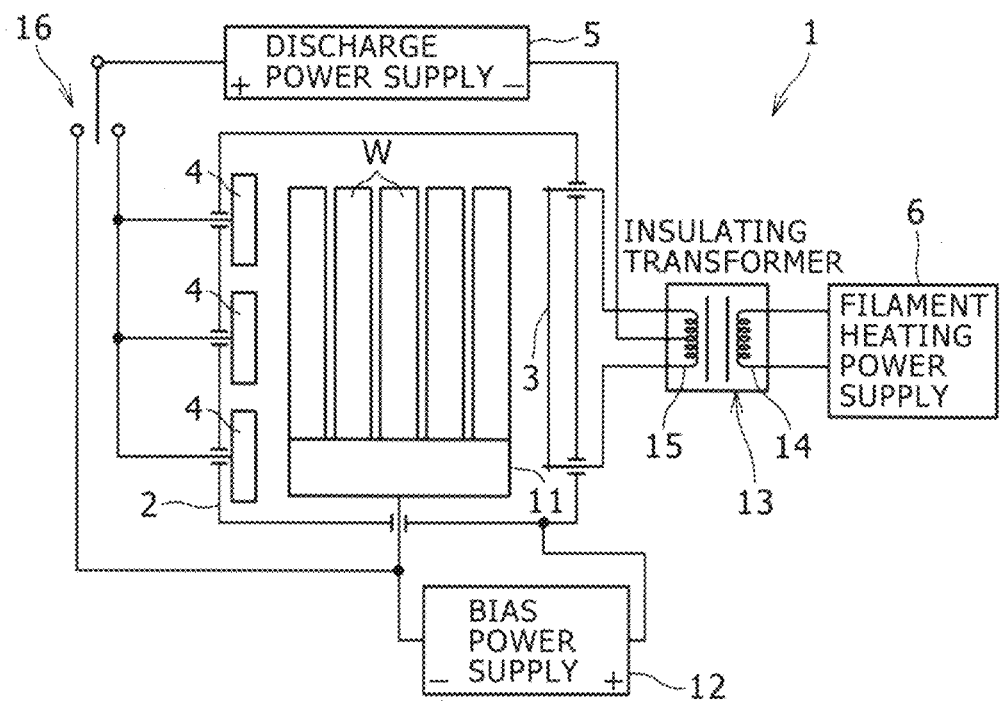
FIG. 1 is a schematic view showing an ion bombardment apparatus according to a first embodiment of the present invention.
Figure 2:
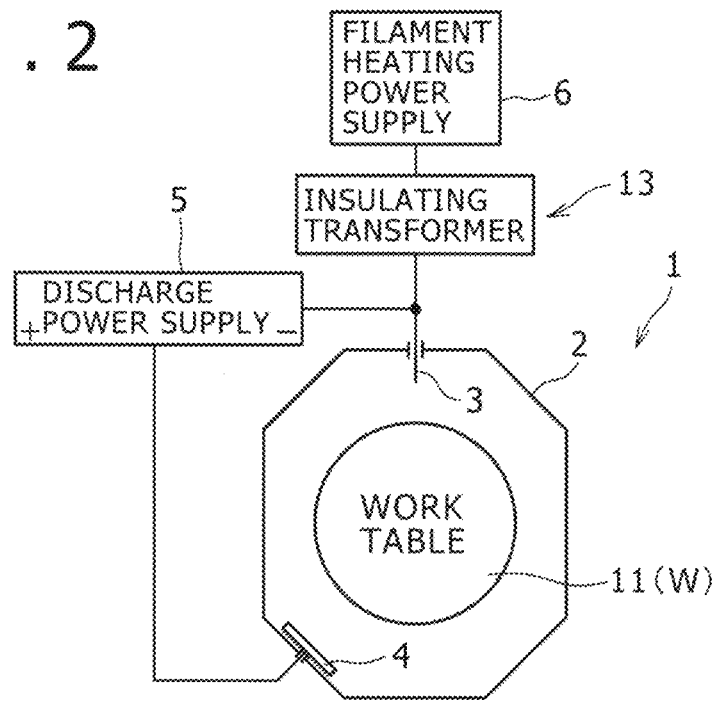
FIG. 2 is a schematic view showing the planar direction of the ion bombardment apparatus according to the first embodiment.

FIGS. 1 and 2 show an ion bombardment apparatus 1 according to a first embodiment of the present invention.

This ion bombardment apparatus 1 is an apparatus for coating surfaces of base materials W installed in a vacuum chamber 2 having an octagonal section with a film by the physical vapor deposition method (PVD method). In substantially center of a bottom surface in the vacuum chamber 2, a rotation type base material holding tool (work table) 11 on which the plurality of base materials W serving as treatment objects is mounted is provided. The vacuum chamber 2 has a heating type thermal electron emission electrode 3 (filament 3) placed on one side surface inside thereof, and anodes 4 placed on another side surface inside thereof.

It should be noted that as shown in FIGS. 1 and 2, the base materials W and the work table 11 supporting the base materials are placed between the filament 3 and the anodes 4. The base materials W are supported by the work table 11 in a standing state (so that the longitudinal direction of the base materials W is set along the up and down direction).

In addition, the ion bombardment apparatus 1 has a discharge power supply 5 for generating plasma discharge upon application of a potential difference between the filament 3 and the anodes 4, and a heating power supply 6 for heating the filament 3. Further, the ion bombardment apparatus also has a bias power supply 12 connected to the work table 11 for applying negative voltage to the base materials W.

A gas introduction port for introducing an inert gas such as argon into the vacuum chamber 2, and a gas discharge port for discharging the inert gas from the vacuum chamber 2 are provided in the vacuum chamber 2 (both the gas introduction and discharge ports are not shown in the figures).

The filament 3 serving as the thermal electron emission electrode is a linear member for irradiating thermal electrons when heated, and is formed of metal such as tungsten (W). The filament 3 is positioned on the substantially opposite side of the anodes 4 across the base materials W (refer to FIG. 2), and placed in such a manner that the discharge between the filament 3 and the anodes 4 is caused across the base materials W. In a case of this embodiment, the filament is placed on one side surface of an octagon, and the anodes are placed on a surface adjacent to a surface facing the one side surface.

As shown in FIG. 1, the filament 3 is placed on an inner wall of the vacuum chamber 2 along the height direction (the up and down direction) via an insulating body (FIGS. 1 and 2 express an insulating state by a gap provided between the filament and the vacuum chamber 2). Both ends thereof are connected to the heating power supply 6 described later.

However, this heating power supply 6 and the filament 3 are not directly connected but connected in an electrically insulated state via an insulating transformer 13 in which the winding number of a primary coil 14 on the input side (heating power supply 6 side) and the winding number of a secondary coil 15 on the output side (filament 3 side) are in a one-to-one relationship.

With this configuration, an AC current outputted from the heating power supply 6 flows through the filament 3 via the insulating transformer 13. The filament 3 is heated by flow of the current, so that the thermal electrons pop out from the filament 3.

It should be noted that on the primary coil 14 side of the insulating transformer 13, a power conditioner or the like (not shown) for controlling a phase of the AC current from the heating power supply 6 is assembled.

Length of the filament 3 is set to be the same or slightly longer than height of the standing base materials W (hereinafter, referred to as the treatment height of the base materials W). The filament 3 is placed at a position overlapping with the base materials W in a side view. Thickness and composition of the filament 3 are uniform over the longitudinal direction thereof.

Therefore, the thermal electrons popping out from this filament 3 are substantially uniform over the treatment height direction of the base materials W. Thus, an amount of the thermal electrons emitted to the base material W side is controlled by potential at a point in the filament 3.

It should be noted that the popping thermal electrons are collided with the argon gas introduced into the vacuum chamber 2 so as to generate argon ions or directly irradiated to the base materials W by a switching circuit 16 described later.

Positive potential (relatively higher potential than the filament 3) is applied to the anodes 4 (positive electrodes), and the anodes are placed on an inner wall surface of the vacuum chamber 2 at a position facing the filament 3 across the base materials W. The anodes 4 are also not electrically connected to the vacuum chamber 2 but attached via an insulating body. It should be noted that as shown in FIG. 1, the anodes 4 are a plurality of (three herein) small positive electrodes arranged along the longitudinal direction of the base materials W and the filament 3. In a case of the plurality of anodes 4, by controlling electrons respectively flowing through the anodes, distribution of plasma in the up and down direction can be further controlled. However, the anodes 4 may be one positive electrode elongated in the longitudinal direction of the base materials W and the filament 3.

Further, arc evaporation sources (cathodes) may be used as the anodes 4. That is, by using the arc evaporation sources attached toward the base materials W in the vacuum chamber 2 as the anodes 4, film formation can also be performed by physical vapor deposition in addition to ion bombardment in the same vacuum chamber 2. In this case, a cathode parallel to the longitudinal direction of the base materials W and the filament 3 or a plurality of small cathodes laminated in the same longitudinal direction is used as the arc evaporation source. By using the cathodes as the anodes, there is no need for newly providing anodes but only a simple circuit switching switch, so that manufacturing cost can be suppressed. Since the electrons flow into the anodes, a temperature of the anodes becomes very high upon excessively heating the electrons. However, since the cathodes have a structure that cooling water already flows as a temperature rise countermeasure at the time of generating plasma, there is no need for a new high-temperature countermeasure. Further, the cathodes are provided with a mechanism for generating a powerful magnetic field in order to control the discharge. Since the electrons flowing into the anodes can be efficiently trapped by the magnetic field, the discharge between the cathodes and the anodes can be stabilized. In a case where an area of the anodes is large in parallel to the filament 3, plasma can be uniformly generated in the vacuum chamber 2.

In a case where the arc evaporation sources (cathodes) are provided in such a way, an arc evaporation source (cathode) discharge power supply is also preferably used as a power supply for the discharge of the filament 3. In such a way, there is no need for a new additional power supply or cables, so that the cost can be suppressed. Since the arc evaporation source (cathode) discharge power supply is not used in a cleaning (etching) process, a cleaning treatment and a film formation treatment can be performed.

As shown in FIG. 1, the discharge power supply 5 is a DC power supply for generating the discharge upon the application of the potential difference between the filament 3 and the anodes 4. A positive side output thereof is connected to the anodes 4, and a negative side output thereof is connected to the filament 3 via the insulating transformer 13.

More specifically, the negative side output of the discharge power supply 5 is connected to a center tap provided in an intermediate part in the winding core direction of the secondary coil 15, and connected to the filament 3 through the secondary coil 15 (refer to FIG. 1).

Meanwhile, as described above, the heating power supply 6 is an AC power supply for letting the current flow through and heating the filament 3 so as to irradiate the thermal electrons to the base materials W. Outputs of terminals are connected to both the ends of the filament 3 via the insulating transformer 13.

With such a configuration, the discharge power supply 5 and the heating power supply 6 are not connected to each other (for example, not connected to the same GND or the like), and at the same time, not connected to the vacuum chamber 2, so that electric independence between the discharge power supply 5 and the heating power supply 6 and electric independence of the discharge power supply 5 and the heating power supply 6 from the vacuum chamber 2 are maintained.

Meanwhile, the bias power supply 12 is a pulse power supply for applying negative charge relative to the vacuum chamber 2 to the base materials W. A positive side output thereof is connected to the vacuum chamber 2, and a negative side output thereof is connected to the base materials W via the work table 11. When a DC current flows as bias voltage to the base materials W, the charged base materials W become potential barriers against the glow discharge between the filament 3 and the anodes 4, so that unstable discharge is caused. However, by using the pulse power supply as the bias power supply 12 as in the present embodiment, the unstable discharge is suppressed, so that distribution of an etching amount of the base materials W by the ion bombardment can be improved.

Further, in addition to such an effect, since the bias power supply 12 applies the voltage having a high-frequency pulse-shaped waveform of 20 kHz or more, preferably 200 kHz or more to the base materials W, the following effects are obtained.

(1) With the frequency of high-frequency pulse bias of 20 kHz or more, the unstable discharge due to the ion bombardment can be prevented. In a case of so-called DC bias which is not the pulse bias, there is a problem that the unstable discharge such as local discharge due to insulation breakdown when foreign substances (insulators such as oxide) are accumulated on the base materials, discharge due to a partial pressure increase by an outgas from the base materials, or discharge caused by electrolytic concentration due to a shape of a projection or the like is generated, so that a discharge signature (arc signature) is left on the base materials. Meanwhile, in a case where the pulse bias is adopted, for example in a case of 20 kHz, it is indicated that a negative potential difference is applied to the base materials in a time of 50 µs. However, since the application time is short, the unstable discharge as described above can be resolved in a short time, and as a result, there is an effect of suppressing the unstable discharge.

(2) Further, by using the high-frequency pulse voltage of 200 kHz or more as the bias voltage, from a difference of mass between the ions of the process gas and the electrons in addition to the above effect of preventing the unstable discharge, moving speed of the electrons becomes much faster than the ions, and as a result, a plasma state that the ions and the electrons are disassociated can be maintained.

(3) Since the plasma state is reliably maintained, the number of the electrons and the ions required for plasma generation can be reduced. This indicates that pressure of the process gas can be lowered. That is, in general, such disassociation of the ions and the electrons requires collision energy of new electrons, and the electrons are generated by disassociation of gas molecules. Thus, the process gas is further required, that is, the pressure of the process gas is required to be increased. However, since the disassociation is maintained, there is no need for adding the process gas, and as a result, the pressure of the process gas can be lowered.

(4) In a case where the pressure of the process gas is low, a distance of a potential gradient (sheath) generated around the base materials is shortened. Thus, even with the base materials having a complicated shape (having a groove part or the like), the sheath is generated along the complicated shape part, so that gas ions such as Ar ions can reach the complicated shape part. As a result, the base materials having a complicated shape can be uniformly cleaned.

(5) Since the plasma state is maintained, an ion current (bias current) flowing through the base materials W can be increased. As a result, intensity of cleaning can be increased.

(6) The high-frequency pulse voltage discharge in which the disassociation is easily caused can be generated even in a state that an external plasma source does not exist (state that there is no discharge of the filament 3). Thus, for example in a case where the base materials having a complicated shape are required to be uniformly cleaned while suppressing irradiation of the Ar ions to the base materials as far as possible, delicate cleaning can be performed by not using the external plasma source but maintaining the bias voltage as low as possible within a range that the discharge is sustained.

Since the discharge power supply 5, the heating power supply 6, and the bias power supply 12 are connected as described above, the bias power supply 12 is not connected to the discharge power supply 5 and the heating power supply 6 described above (for example, not connected to the same GND or the like), so that the three power supplies 5, 6, 12 are electrically independent from each other.

Therefore, the power supplies 5, 6, 12 do not form a loop via the vacuum chamber 2 or a common ground. Even when GNDs actually have different potential from each other, current control of the power supplies can be stably performed.

As shown in FIG. 1, the ion bombardment apparatus 1 according to the first embodiment is provided with the switching circuit 16 capable of switching the positive side output of the discharge power supply 5 between connection to the anodes 4 and connection to the base materials W. Therefore, in a case where the positive side output of the discharge power supply 5 is connected to the base materials W, the base materials W have higher potential (positive potential) than the filament 3 by the discharge power supply 5. Thus, the ion bombardment apparatus can also be used for electron heating use of irradiating the thermal electrons emitted from the filament 3 to the base materials W so as to heat the base materials W.

Hereinafter, a use mode of the ion bombardment apparatus 1 according to the first embodiment, that is, a method for cleaning of the base materials W before the physical vapor deposition will be described.

Firstly, the base materials W are fixed to the work table 11 in the vacuum chamber 2, and a heating treatment and the like are performed in the evacuated chamber 2. After a temperature of the base materials W is controlled to be a temperature for cleaning (temperature suitable for cleaning the surfaces), the argon gas is introduced into the vacuum chamber 2 for example by 100 ml/min. The argon gas may be introduced at the same time as evacuation.

Under an argon gas atmosphere, a current controlled to about 5 V flows from the discharge power supply 5, and in a state that a potential difference of about 100 V or more is applied between the filament 3 and the anodes 4, an AC current flows from the heating power supply 6. Thereby, at the time of moving the thermal electrons generated from the filament 3 by the heating power supply 6 in the direction of the anodes 4 having relatively positive potential, the argon gas in the vicinity of the base materials W is ionized and brought into a plasma state. Thus, a glow discharge state is generated, and the argon ions are generated in the vicinity of the base materials W.

At this time, a phase of the AC current by the power conditioner of the insulating transformer 13 and the argon gas to be suctioned into and discharged from the vacuum chamber 2 are controlled at the same time, so that a value of the current flowing through the filament 3 and gas pressure of the argon gas atmosphere around the base materials W are controlled to be in a glow-dischargeable state between the filament 3 and the anodes 4.

After this process, in a state that plasma is generated around the base materials W, the bias power supply 12 is started up, negative bias voltage is applied to the base materials W, and the argon ions having positive charge are irradiated to the base materials W (bombardment), so that the surfaces of the base materials W are cleaned. At this time, potential in a pulse shape having a frequency of 20 kHz or more, preferably 200 kHz or more is applied to the base materials W.

FIG. 3A shows a relationship between the pulse frequency of the bias power supply and the generation number of the unstable discharge. As shown in this figure, with the pulse frequency of the bias power supply of 20 kHz, the generation number of the unstable discharge can be suppressed.

FIG. 3B shows a relationship between the pulse frequency of the bias power supply and a bias current (ion current). As shown in this figure, by increasing the pulse frequency of the bias power supply, the discharge can be generated even in a state that there is no external plasma source, and the ion current is increased in accordance with the increase in the frequency. The increase in the ion current indicates that the plasma state is reliably maintained. When plasma generated around the base materials W is reliably maintained, the pressure of the process gas can be lowered, and accordingly, the distance of the potential gradient (sheath) generated around the base materials W is shortened. Therefore, even with the base materials having a complicated shape (having a groove part or the like), the sheath is generated along the complicated shape part, so that the gas ions can reach the complicated shape part. As a result, the base materials having a complicated shape can be uniformly cleaned.

FIG. 3B indicates a tendency that even with any bias voltage, the discharge is generated with the pulse frequency of 200 kHz or more and the bias current is increased. At this point, the pulse frequency of the bias power supply 12 is preferably 20 kHz or more, more preferably 200 kHz or more.

A cleaning (etching) evaluation method in a case where the pulse power supply is used as the bias power supply 12 in such a way will be shown below.

Figure 4:
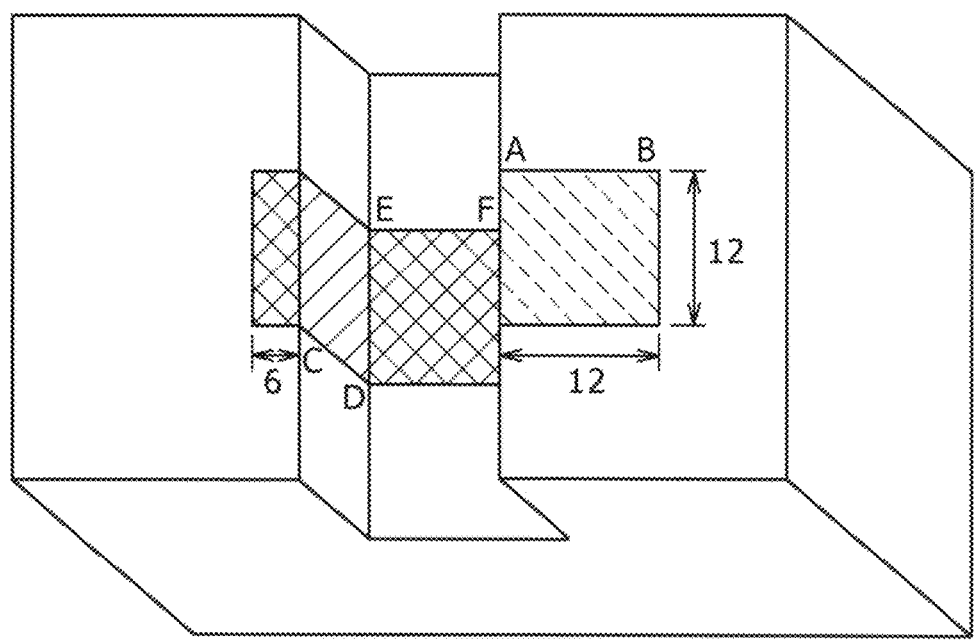
FIG. 4 is a view showing a test piece folder used in an evaluation method.

FIG. 4 shows a test piece folder used in the evaluation method. This test piece folder is to confirm effectiveness of cleaning in the groove part of the base materials W. After three SKH51 test pieces (12 mm square, thickness of 6 mm) were attached to (a near front surface, a side surface of groove, and a far front surface of) this test piece folder and cleaned, the film formation treatment was performed and adherence of a thin film at positions was measured. A part A and a part B of FIG. 4 are parts of the test piece attached to the same surface as the front surface of the test piece folder, a part C and a part D are parts of the test piece attached to a surface orthogonal to the part A and the part B, and a part E and a part F are parts of the test piece serving as deepest groove parts where the adherence of the thin film is considerably lowered by conventional etching.

Under a condition according to the present embodiment (new condition), on the base material subjected to the bombardment for 15 minutes with the current of the filament 3 of 5 A, the argon gas pressure of 0.15 to 0.2 Pa, and the bias voltage of 400 V (pulse voltage of 350 kHz), about 3 μm of TiAlN film by the AIP (arc ion plating) method was formed. It should be noted that under a conventional condition (standard condition) for comparison, on the base material subjected to the bombardment for 15 minutes with the current of the filament 3 of 40 A, the argon gas pressure of 2.7 Pa, and the bias voltage of 400 V (DC voltage), the same thin film was formed.

Table 1 shows results of a scratch test in which strength of the TiAlN thin film was examined.

TABLE 1

|  |  | A | B | C | D | E | F |
|---|---|---|---|---|---|---|---|
| Standard condition | Lc1 | 65 | 63 | 58 | 55 | 40 | 47 |
|  | Lc2 | 90 | 90 | 88 | 55 | 53 | 47 |

TABLE 1-continued

|  |  | A | B | C | D | E | F |
|---|---|---|---|---|---|---|---|
| New condition | Lc1 | 62 | 63 | 61 | 65 | 60 | 60 |
|  | Lc2 | 80 | 82 | 89 | 83 | 70 | 67 |

Lc1: Initial exfoliation (minute exfoliation)
Lc2: Total exfoliation
Unit: N

This scratch test is to test with what extent of load (N) initial exfoliation (Lc1) is caused and with what extent of load (N) total exfoliation (Lc2) is caused when the thin film of the test piece is scratched by a diamond indenter provided with a predetermined taper on a front end by a predetermined load. The scratch test used in the present evaluation complies with the evaluation method of JIS R 3255.

As clear from the results of Table 1, in the part D, the part E, and the part F (groove parts) where the adherence is weak under the conventional standard condition, the adhesion is improved by about 30% under the new condition.

Figure 5:
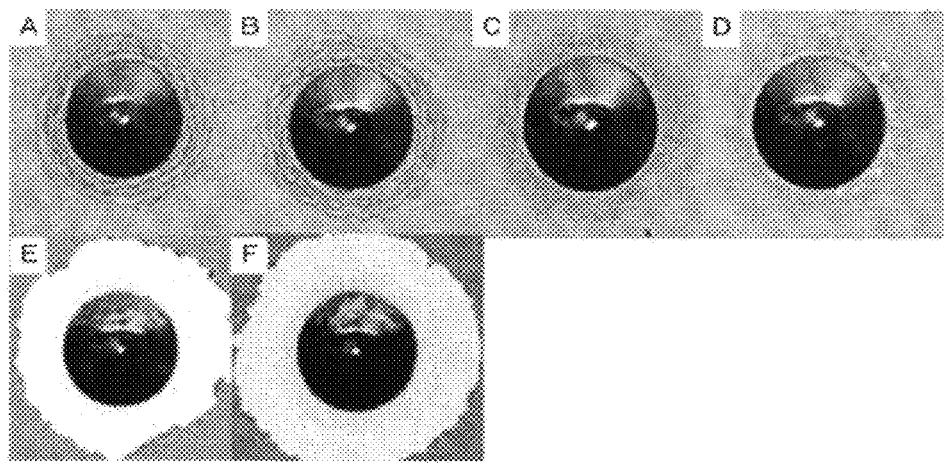
FIG. 5 is a diagram showing results of an adherence test serving as the evaluation method (conventional condition (standard condition))
Figure 6:
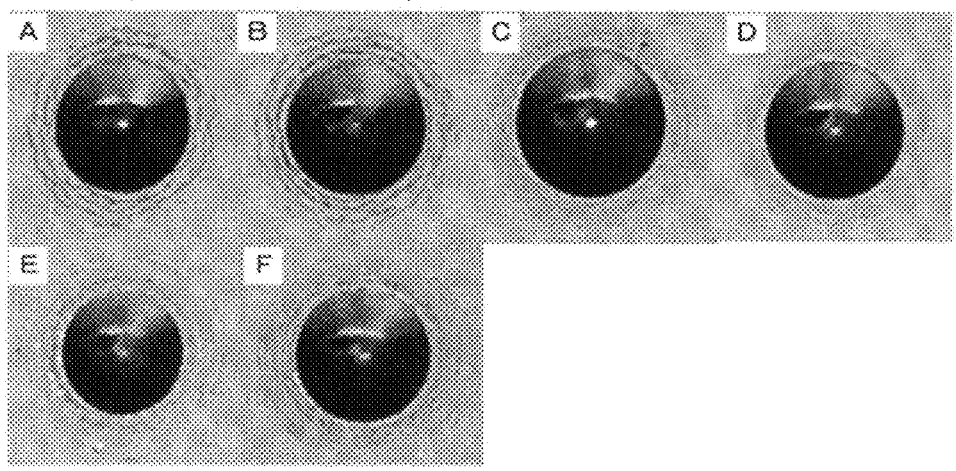
FIG. 6 is a diagram showing results of an adherence test serving as the evaluation method (condition of the present invention (new condition))

FIGS. 5 and 6 show results of adherence evaluation. This adherence evaluation is to form a pressure signature by using a Rockwell Hardness C-Scale testing machine so as to visually observe the signature. This observation is to drive the diamond indenter into the thin film of the test piece under a predetermined condition so as to form a hole and visually observe an exfoliation state around the hole. The present evaluation complies with the evaluation method of JIS G 0202.

As shown in FIGS. 5 and 6, as well as Table 1, in the groove parts (the part E and the part F in particular), it can be confirmed that the adhesion is improved to a large extent. It should be noted that a white part shown in the part E or the part F of FIG. 5 is a part where the thin film is exfoliated, and no exfoliation is generated in the part E or the part F of FIG. 6 corresponding to this figure.

It should be noted that although the ion bombardment treatment is described as above, when an arc evaporation source attached toward the base materials W is also provided in the vacuum chamber 2 (including a use of the arc evaporation source as the anodes 4), the film formation treatment by the physical vapor deposition can also be performed in the same vacuum chamber 2.

It should be noted that at the time of cleaning the base materials W, until the glow discharge is started between the filament 3 and the anodes 4, the heating current flowing through the filament 3 and the gas pressure of the argon gas in the vacuum chamber 2 are increased. After the start of the discharge, the heating current and the gas pressure are lowered to the values with which the discharge is sustainable. Thereby, a high-voltage power supply is not required as the discharge power supply 5, so that an occupied space and the cost can be suppressed.

The treatment described above is realized by a program in a control portion (not shown) provided in the ion bombardment apparatus 1. This control portion controls the power supplies 5, 6, 12 and the argon gas pressure in accordance with the program.

By adopting the ion bombardment apparatus 1 and the method for cleaning before the film formation using this apparatus 1 described above, the thermal electrons can be irradiated to the base materials W uniformly in the height direction, so that the base materials W can be uniformly cleaned. By wiring the discharge power supply 5 and the heating power supply 6 independently from the vacuum chamber 2, the current control of the power supplies is stabilized.

In particular, since the pulse frequency of 200 kHz or more is used as the bias power supply, the plasma state that the ions and the electrons are disassociated can be maintained, so that the pressure of the process gas can be maintained to be low. In a case where the pressure of the process gas is low, the distance of the potential gradient (sheath) generated around the base materials is shortened. Thus, even with the base materials having a complicated shape (having a groove part or the like), the sheath is generated along the complicated shape part, so that the gas ions can reach the complicated shape part. Consequently, the base materials having a complicated shape can be uniformly cleaned.

Second Embodiment

FIG. 7 shows the ion bombardment apparatus 1 according to a second embodiment of the present invention.

The ion bombardment apparatus 1 according to the second embodiment is different from the apparatus of the first embodiment in terms of a point that the thermal electron emission electrode is not formed by one filament 3 but a plurality of filaments 3 is placed over the treatment height of the base materials W (so as to cover the treatment height of the base materials W). By using the plurality of filaments 3, disconnection of the filaments 3 can be suppressed and a replacement task thereof is easily performed.

In addition, the second embodiment is provided with a shutter 31 for covering the above filaments 3. By this shutter 31, attachment of dirt to the filaments 3 is prevented.

Thereby, the ion bombardment apparatus can prevent that at the time of decreasing thermal electron emission efficiency of the filaments 3 themselves due to the attachment of the dirt or heating the filaments 3, the attached dirt is evaporated and attached (to contaminate) the surfaces of the base materials W or the like.

Third Embodiment

FIG. 8 shows the ion bombardment apparatus 1 according to a third embodiment of the present invention.

A characteristic of the ion bombardment apparatus 1 according to the third embodiment is that as the cathodes (arc evaporation sources) used as the anodes 4, not one cathode (one-phase cathode) but a plurality of cathodes (plural-phase cathodes) is used.

Specifically, two cathodes are placed at positions facing the filament 3 around the work table 11. By placing in such a way, a further uniform treatment (the cleaning treatment and the film formation treatment) can be performed.

The embodiments disclosed herein are not a limitation but an example in all respects. The scope of the present invention is specified not by the above description but by the claims and intended to include equal meanings to the claims and all the changes within the claims.

For example, the ion bombardment apparatus 1 is provided with the DC power supply dedicated for cleaning as the discharge power supply 5. However, a power supply used in a process other than cleaning of the base materials W (such as a drive power supply for electromagnetic coils placed on the back of the arc evaporation source and an electron heating power supply) may also serve as the discharge power supply 5.

The phase of the current flowing from the heating power supply 6 to the thermal electron emission electrode 3 is controlled by the power conditioner described above. However, pulse width modulation (PWM) control or the like may be performed. In this case, a potential change of the thermal electron emission electrode 3 relative to the vacuum chamber 2 can be flattened.

The switching circuit 16 described in the paragraph of the first embodiment can also be applied to the second embodiment or the third embodiment.

What is claimed is:

1. An ion bombardment apparatus for cleaning a surface of a base material placed in a vacuum chamber by irradiating gas ions generated in the vacuum chamber, comprising:
   a work table for supporting the base material;
   a heating type thermal electron emission electrode placed on one inner surface of the vacuum chamber and formed by a filament;
   an anode placed on another inner surface of the vacuum chamber, the anode for receiving a thermal electron from said thermal electron emission electrode;
   a discharge power supply for generating a glow discharge upon application of a potential difference between said thermal electron emission electrode and said anode, the discharge power supply being insulated from the vacuum chamber;
   a heating power supply for heating said thermal electron emission electrode so as to emit the thermal electron;
   a bias power supply for applying negative potential with respect to the vacuum chamber to the base material, the bias power supply serving as a pulse power supply, wherein the gas ions generated in the vicinity of the base material by said discharge power supply, said heating power supply, and said bias power supply are capable of being irradiated to the surface of the base material; and
   a switch connected to selectively switch the discharge power supply between the anode and the base material, wherein
   the work table is negatively biased by the bias power supply and placed at a position in which the work table supports the base material and allows the supported base material to be placed between said thermal electron emission electrode and said anode.

2. The ion bombardment apparatus according to claim 1, therein
   the negative potential applied to the base material by said pulse power supply has a frequency of 20 kHz or more.

3. The ion bombardment apparatus according to claim 2, therein
   the negative potential applied to the base material by said pulse power supply has a frequency of 200 kHz or more.

4. The ion bombardment apparatus according to claim 1, wherein
   said thermal electron emission electrode includes a plurality of filaments.

5. The ion bombardment apparatus according to claim 1, wherein
   a positive side output of said discharge power supply is selectively connectable to said anode and the base material.

6. The ion bombardment apparatus according to claim 1, wherein a length of said thermal electron emission electrode is the same as or more than a space provided in the vacuum chamber where the base material is treated.

7. The ion bombardment apparatus according to claim 1, wherein the work table is positioned at a position in which the work table allows the base material to block a straight line connecting between said thermal electron emission electrode and said anode.

8. The ion bombardment apparatus according to claim 1, wherein, the heating power supply is separate from the discharge power supply and outputs an AC current, and the ion bombardment apparatus further comprises an insulating transformer for transmitting power from the heating power supply to the thermal emission electrode, the insulating transformer connecting between the heating power supply and the thermal emission electrode in electrically insulating state.

9. The ion bombardment apparatus according to claim 1, wherein the filament comprises a central tap.

10. The ion bombardment apparatus according to claim 9, wherein the discharge power supply is connected to the central tap of the filament.

11. The ion bombardment apparatus according to claim 9, wherein the transformer is an insulating transformer, and the filament is connected across a secondary coil of the insulating transformer.

12. The ion bombardment apparatus according to claim 1, wherein the discharge power supply, the heating power supply, and the bias power supply are electrically independent from each other.

13. The ion bombardment apparatus according to claim 1, wherein when the switch connects the discharge power supply to the anode, the anode functions as an arc evaporation source.

14. A method for cleaning of a surface of a base material before film formation using the ion bombardment apparatus according to claim 1, comprising the steps of:

maintaining a heating current flowing through said thermal electron emission electrode and gas pressure of a gas atmosphere in the vacuum chamber until a glow discharge is started between said thermal electron emission electrode and said anode, the heating current and the gas pressure being required for start of the glow discharge;

lowering the gas pressure and the heating current to values with which the discharge is sustainable after the discharge is started; and activating said bias power supply so as to apply pulse-shaped bias voltage to the base material after the discharge is started.

* * * * *